US009890455B2

(12) United States Patent
Myo et al.

(10) Patent No.: US 9,890,455 B2
(45) Date of Patent: Feb. 13, 2018

(54) PRE-HEAT RING DESIGNS TO INCREASE DEPOSITION UNIFORMITY AND SUBSTRATE THROUGHPUT

(75) Inventors: Nyi O. Myo, San Jose, CA (US); John S. Webb, Sunnyvale, CA (US); Masato Ishii, Sunnyvale, CA (US); Xuebin Li, Santa Clara, CA (US); Zhiyuan Ye, San Jose, CA (US); Ali Zojaji, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1871 days.

(21) Appl. No.: 13/250,906

(22) Filed: Sep. 30, 2011

(65) Prior Publication Data
US 2012/0103263 A1    May 3, 2012

Related U.S. Application Data

(60) Provisional application No. 61/408,422, filed on Oct. 29, 2010.

(51) Int. Cl.
| | | |
|---|---|---|
| C23C 16/455 | (2006.01) | |
| C23C 16/458 | (2006.01) | |
| H01L 21/687 | (2006.01) | |
| H01L 21/673 | (2006.01) | |

(52) U.S. Cl.
CPC .... *C23C 16/45591* (2013.01); *C23C 16/4584* (2013.01); *C23C 16/4585* (2013.01); *C23C 16/45502* (2013.01); *H01L 21/687* (2013.01); *H01L 21/68792* (2013.01); *H01L 21/67386* (2013.01)

(58) Field of Classification Search
CPC ............ C23C 16/4585; C23C 16/4586; H01L 21/687–21/68792
See application file for complete search history.

(56) References Cited

U.S. PATENT DOCUMENTS

| | | | | |
|---|---|---|---|---|
| 1,491,419 | A * | 4/1924 | Power | A47K 13/16 312/50 |
| 5,334,257 | A * | 8/1994 | Nishi | H01L 21/67781 118/500 |
| 5,580,388 | A * | 12/1996 | Moore | C23C 16/4404 118/500 |

(Continued)

*Primary Examiner* — Gordon R Baldwin
*Assistant Examiner* — Mirza Israr Javed
(74) *Attorney, Agent, or Firm* — Patterson + Sheridan LLP (57) ABSTRACT

Embodiments of the present invention generally relates to apparatus for use in film depositions. The apparatus generally include pre-heat rings adapted to be positioned in a processing chamber. In one embodiment, a pre-heat ring includes a ring having an inner edge and an outer edge. The outer edge has a constant radius. The inner edge is oblong-shaped and may have a first portion having a constant radius measured from a center of a circle defined by an outer circumference of the ring. A second portion may have a constant radius measured from a location other than the center of the outer circumference. In another embodiment, a processing chamber includes a pre-heat ring positioned around the periphery of a substrate support. The pre-heat ring includes an inner edge having a first portion, a second portion, and one or more linear portions positioned between the first portion and the second portion.

17 Claims, 5 Drawing Sheets

(56) References Cited

U.S. PATENT DOCUMENTS

| | | | | |
|---|---|---|---|---|
| 5,820,686 | A | * | 10/1998 | Moore .............. C23C 16/4581 118/500 |
| 6,000,068 | A | * | 12/1999 | Chavis ................. A47K 13/16 4/239 |
| 6,364,957 | B1 | * | 4/2002 | Schneider .......... C23C 16/4585 118/500 |
| 6,780,251 | B2 | * | 8/2004 | Tometsuka .......... C23C 16/4583 118/725 |
| 2005/0106524 | A1 | * | 5/2005 | Ose ................... H01L 21/67103 432/247 |
| 2005/0160992 | A1 | * | 7/2005 | Sundar ............... C23C 16/4585 118/729 |
| 2005/0178334 | A1 | * | 8/2005 | Shinma .................. C23C 14/50 118/725 |
| 2005/0191811 | A1 | * | 9/2005 | Ogihara ............. C23C 16/4585 438/296 |
| 2006/0151116 | A1 | * | 7/2006 | Wu .......................... C23F 4/00 156/345.46 |
| 2007/0227441 | A1 | * | 10/2007 | Narahara ............... C23C 16/24 117/84 |
| 2012/0131740 | A1 | * | 5/2012 | Rone ..................... A47K 13/14 4/245.3 |

\* cited by examiner

PRE-HEAT RING DESIGNS TO INCREASE DEPOSITION UNIFORMITY AND SUBSTRATE THROUGHPUT

CROSS-REFERENCE TO RELATED APPLICATIONS

This application claims benefit of U.S. Provisional Patent Application Ser. No. 61/408,422, filed Oct. 29, 2010, which is herein incorporated by reference.

BACKGROUND OF THE INVENTION

Field of the Invention

Embodiments of the present invention generally relate to a gas pre-heat ring for a substrate processing chamber.

Description of the Related Art

Semiconductor substrate processing throughput is a measure of the number of substrates that can be processed during a given time period. The higher a manufacturer's substrate throughput, the less costly it is for the manufacturer to produce a single substrate; thus allowing the manufacturer to be more competitive in the market place.

Some film deposition processes use a cycle of material deposition followed by a cycle of etching the deposited material. This cyclical process can be repeated several times to dozens of times per substrate, depending on the desired film thickness. Thus, the more quickly the manufacturer is able to transition from the deposition phase to the etch phase, and vice versa, the higher the substrate throughput that can be achieved. However, a manufacturer cannot simply increase the deposition or etch process gas flow rates to the chamber. An increased gas flow rate can result in turbulent gas flow or concentration dilution of precursor gas, which can result in non-uniform film deposition on a substrate surface.

Therefore, there is a need for a processing apparatus having improved control of flow characteristics of a process gas.

SUMMARY OF THE INVENTION

Embodiments of the present invention generally relates to apparatus for use in film depositions. The apparatus generally include pre-heat rings adapted to be positioned in a processing chamber. In one embodiment, a pre-heat ring includes a ring having an inner edge and an outer edge. The outer edge has a constant radius. The inner edge is oblong-shaped and may have a first portion having a constant radius measured from a center of a circle defined by an outer circumference of the ring. A second portion may have a constant radius measured from a location other than the center of the outer circumference. In another embodiment, a processing chamber includes a pre-heat ring positioned around the periphery of a substrate support. The pre-heat ring includes an inner edge having a first portion, a second portion, and one or more linear portions positioned between the first portion and the second portion.

In one embodiment, a pre-heat ring for a substrate processing chamber comprises an incomplete ring of material having a gap formed therein. The incomplete ring of material includes an inner edge and an outer edge. The outer edge has a constant radius, and the inner edge has an oblong shape.

In another embodiment, a processing chamber comprises a chamber body, an exhaust outlet positioned on a first side of the chamber body, and a gas inlet positioned on a second side of the chamber body. The processing chamber also comprises a substrate support disposed within the chamber body and a pre-heat ring positioned around a periphery of the substrate support. The pre-heat ring comprises an incomplete ring of material having a gap formed therein. The incomplete ring of material includes an inner edge and an outer edge. The outer edge has a constant radius. The inner edge has an oblong shape.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

Embodiments of the present invention generally relates to apparatus for use in film depositions. The apparatus generally include pre-heat rings adapted to be positioned in a processing chamber. In one embodiment, a pre-heat ring includes a ring having an inner edge and an outer edge. The outer edge has a constant radius. The inner edge is oblong-shaped and may have a first portion having a constant radius measured from a center of a circle defined by an outer circumference of the ring. A second portion may have a constant radius measured from a location other than the center of the outer circumference. In another embodiment, a processing chamber includes a pre-heat ring positioned around the periphery of a substrate support. The pre-heat ring includes an inner edge having a first portion, a second portion, and one or more linear portions positioned between the first portion and the second portion.

Embodiments disclosed herein may be practiced in the Applied CENTURA® RP EPI chamber, available from Applied Materials, Inc. of Santa Clara, Calif. It is contemplated that other chambers available from other manufacturers may also benefit from embodiments disclosed herein.

FIG. 1 is a cross sectional view of a processing chamber according to an embodiment of the invention. The processing chamber 100 comprises a chamber body 102, support systems 104, and a controller 106. The chamber body 102 includes an upper portion 112 and a lower portion 114. The upper portion 112 includes the area within the chamber body 102 above the substrate support 138 and pre-heat ring 123.

Figure 1A:
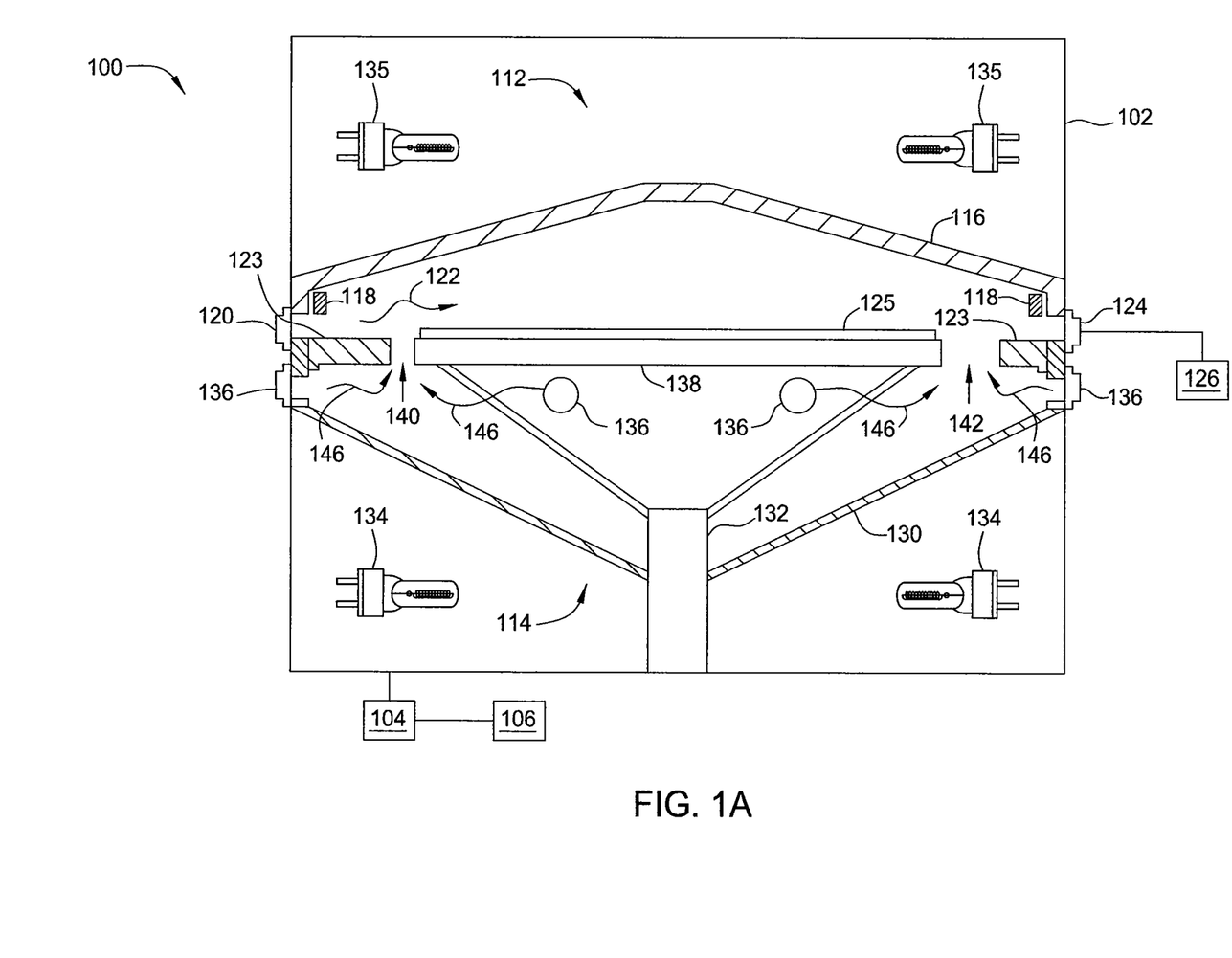
FIG. 1A is a cross sectional view of a processing chamber according to an embodiment of the invention.

The lower portion 114 includes the area within the chamber body 102 beneath the substrate support 138 and the pre-heat ring 123.

The upper portion 112 is disposed on and above the lower portion 114 and includes a lid 116, a liner 118, and one or more upper lamps 135. An upper gas inlet 120 is coupled to the chamber body 102 and adapted to provide a process gas 122 to the interior of the chamber body 102 above substrate 125 during processing. An exhaust outlet 124 is coupled to the chamber body 102 on the opposite side of the chamber body 102 compared to the upper gas inlet 120. The exhaust outlet 124 is adapted to remove process gases from chamber body 102 subsequent to and during processing using a vacuum system 126.

The lid 116 is positioned above the substrate support 138 within chamber body 102. The lid 116 is formed from quartz to allow infrared radiation (e.g., heat) from upper lamps 135 to pass therethrough to heat components inside the processing chamber 100, including substrate 125. The lid 116 has a dome shape; however, it is contemplated that lids having other shapes, such as flat or reverse curve lids, may also be used.

The lower portion 114 is positioned beneath the substrate support 138. The lower portion 114 includes a lower dome 130, a substrate support assembly 132, one or more lower lamps 134, and a plurality of lower gas inlets 136. The lower dome is 132 is coupled to the substrate support assembly 132 and the chamber body 102 to prevent process gases from reaching undesired locations of the processing chamber 100. The lower dome 130 is generally formed from the same materials as the lid 116 to allow heat from lower lamps 134 to heat interior chamber components prior to and during processing.

The substrate support assembly 132 is coupled to and positioned beneath substrate support 138. The substrate support assembly 132 is adapted to rotate the substrate support 138 during processing. The components of the substrate support assembly 132 are fabricated from silicon carbide, but may also be fabricated form quartz, or graphite coated with silicon carbide.

The pre-heat ring 123 is coupled to the chamber body 102 and is disposed around the periphery of the substrate support 138. The top surface of the pre-heat ring 123 is in the same plane as the top surface of the substrate support 138; however, it is contemplated that the top surface of the pre-heat ring 123 and the top surface of the substrate support 138 may alternatively be positioned at different heights. The gaps 140 and 142 are formed between the substrate support 138 and the pre-heat ring 123. The gap 140 is formed near the upper gas inlet 120 and has a constant width around approximately half the circumference of the substrate support 138. For example, the gap 140 may have a constant width around about 45 percent to about 49.9 percent of the circumference of the substrate support. The gap 142 has a greater width than gap 140. The gap 142 is formed near the exhaust outlet 124 on the opposite side of the chamber as compared to the gap 140. The gap 142 has a maximum width near the exhaust outlet 124. The width of the gap 142 decreases in a direction from the exhaust outlet 124 towards the upper gas inlet 120 for approximately half the circumference of the substrate support 138, until the width of the gap is the same as the gap 140. As mentioned previously, the width of the gap 140 is then maintained for the remainder of the circumference. Although the gaps 140 and 142 are shown as being different sizes, it is contemplate that the gaps 140 and 142 may have equivalent widths depending on the shape of the pre-heat ring 123.

The pre-heat ring 123 is positioned around the substrate support 138 during processing. The pre-heat ring 123 is formed from silicon carbide, but it is contemplated that the pre-heat ring 123 may be formed from other materials such quartz or graphite coated with silicon carbide. During processing, pre-heat ring 123 is heated by the upper lamps 135 and the lower lamps 134. The pre-heat ring 123 facilitates pre-heating of the process gas 122 as the process gas 122 enters the chamber body 102 through upper gas inlet 120 and flows over the pre-heat ring 123.

The support system 104 includes components used to execute and monitor pre-determined processes, such as the growth of epitaxial films in the processing chamber 100. The support system 104 includes one or more of gas panels, gas distribution conduits, vacuum and exhaust sub-systems, power supplies, and process control instruments. A controller 106 is coupled to the support system 104 and is adapted to control the processing chamber 100 and support system 104. The controller 106 includes a central processing unit (CPU), a memory, and support circuits. Instructions resident in controller 106 may be executed to control the operation of the processing chamber 100.

Processing chamber 100 is adapted to perform one or more film formation or deposition processes therein. For example, a silicon carbide epitaxial growth process may be performed within processing chamber 100. It is contemplated that other processes may be performed within processing chamber 100. Processing chamber 100 is especially advantageous for cyclical deposition-etch processes used to form a material layer on substrate 125.

A cyclical deposition-etch process is a multiple step process used to form a film on the surface of substrate 125. In a first step, a process gas 122 is provided to the processing chamber 100 through upper gas inlet 120. The process gas 122 flows over and is heated by pre-heat ring 123. The process gas 122 flows parallel to (across) the surface of the rotating substrate 125 and thermally decomposes on substrate 125 with the assistance of heat from lamps 135 and 134. The process gas 122 is then removed from the processing chamber 100 through exhaust outlet 124 on the opposite side of the chamber body 102. During the deposition process, a purge gas 146, such as hydrogen, is introduced to the chamber body 102 from the lower gas inlets 136. The purge gas 146 increases the pressure beneath the substrate support 138 in the lower portion 114 of the processing chamber 100. The increased pressure caused by purge gas 146 prevents process gas 122 from entering the lower portion 114 of the processing chamber 100 and undesirably depositing material on the back side of the substrate support 138 or on the substrate support assembly 132.

After a desired amount of time, such as the amount of time required to deposit about 1 angstrom to about 5 angstroms of material, the flow of the process gas 122 is ceased, and the process gas 122 is exhausted from the chamber body 102. Subsequently, an etching gas is provided to the processing chamber 100. The etching gas is introduced to the processing chamber 100 through the upper gas inlet 120. It is contemplated that the etching gas may be introduced to the chamber through gas inlets other than or in addition to the upper gas inlet 120. The etching gas flows parallel to the surface of the substrate 125 similar to the process gas 122. Additionally, the purge gas 146 is also introduced to the processing chamber 100 simultaneously with the introduction of the etching gas to prevent etching gas from flowing beneath the substrate support 138 and undesirably etching chamber components.

The deposition step and the etching step of the deposition-etch process occur at pressures which can vary by tens of magnitude in difference. For example, the deposition step may occur at about 10 Torr, while the etch step may occur at about 300 Torr. Thus, the volume of purge gas 146 which needs to be introduced to the processing chamber 100 during the deposition and the etch step to prevent gases from entering the lower portion 114 also varies by tens of magnitude in difference. The more quickly the purge gas 146 can be provided to the lower portion 114 to prevent the process gas 122 or the etch gas from flowing below the substrate support 138, the more quickly the transition between the deposition and the etch steps can occur. Consequently, the quicker the transition between process steps, the higher the throughput which can be achieved.

However, in typical deposition chambers in which the gaps 140 and 142 are equal in width, and in which the pre-heat rings are solid, the volumetric flow rate of purge gas 146 cannot simply be increased due to the negative impact on process uniformity. In a typical deposition chamber, approximately half of the purge gas 146 is exhausted from the chamber by traveling through gap 142 and out exhaust outlet 124. The remainder of the purge gas 146 travels through gap 140, over the surface of the substrate 125, and out the exhaust outlet 124. At increased volumetric flow rates (such as about 10 standard liters per minute), the purge gas 146 flowing through the gap 140 combines with the process gas 122 or the etching gas flowing from the upper gas inlet 120. This creates turbulence within and reduces the concentration of the process gas 122 or the etching gas. The reduction in concentration combined with the turbulent flow of the process gas 122 or the etching gas causes increased process sensitivity, which ultimately results in a non-uniform deposition of material across the surface of substrate 125. Further, the increased flow of purge gas 146 through gap 140 could push, move or slide the substrate 125 along the surface of the substrate support 138, thereby affecting processing uniformity. Thus, in order to increase the flow rate of the purge gas 146 (thereby increasing process uniformity), it is desirable to control the flow characteristics of the process gas 122, the purge gas 146 and an etching gas to achieve a uniform film deposition on the substrate 125.

The pre-heat ring 123 is positioned around the periphery of the substrate support 138 and is shaped to effect a greater volumetric gas flow rate around a first side of the substrate support 138 (through the gap 142) as compared to a second side (through the gap 140). As illustrated in FIG. 1A, the gap 142 is greater than the gap 140 and thus less restricting regarding the flow of the purge gas 146. Therefore, a greater amount of the purge gas 146 travels through the gap 142 as compared to the gap 140. Since the purge gas 146 flowing through the gap 142 does not pass over the substrate 125, any turbulence or concentration dilution caused by the purge gas 146 near the exhaust outlet 124 should not effect the uniformity of the film deposited on the substrate 125. This allows for a greater flow rate of purge gas 146 to be provided to the processing chamber 100 (thereby reducing the time required to perform each step of the deposition-etch cycle), while still preventing back side deposition and while maintaining film deposition uniformity. Additionally, the reduction in gas flow through the gap 140 reduces the potential of inadvertently moving substrate 125 by reducing turbulence as well as the force applied to the leading edge of the substrate 125 by the purge gas 146. Thus, the pre-heat ring 123 allows a purge gas to be quickly provided to the processing chamber 100 to facilitate higher substrate throughput by providing effective control over gas flow characteristics.

Figure 1B:
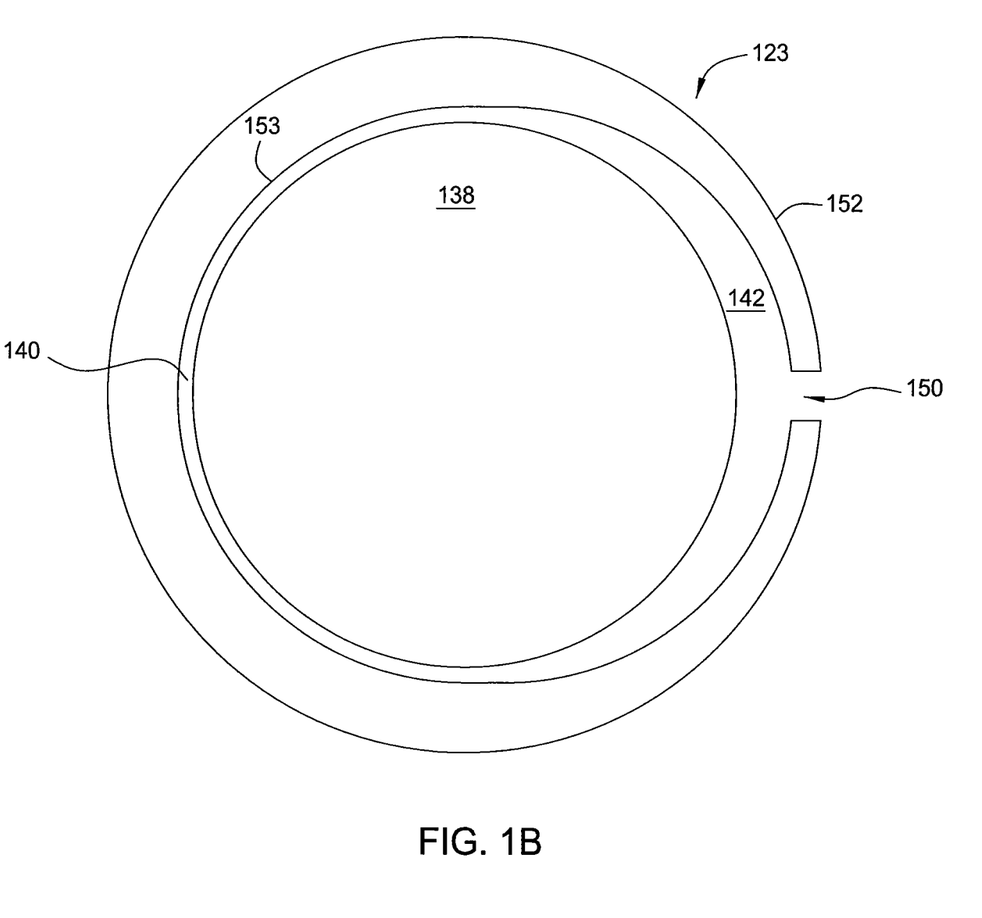
FIGS. 1B and 1C are top plan views of the pre-heat ring shown in the embodiment of FIG. 1A.
Figure 1C:
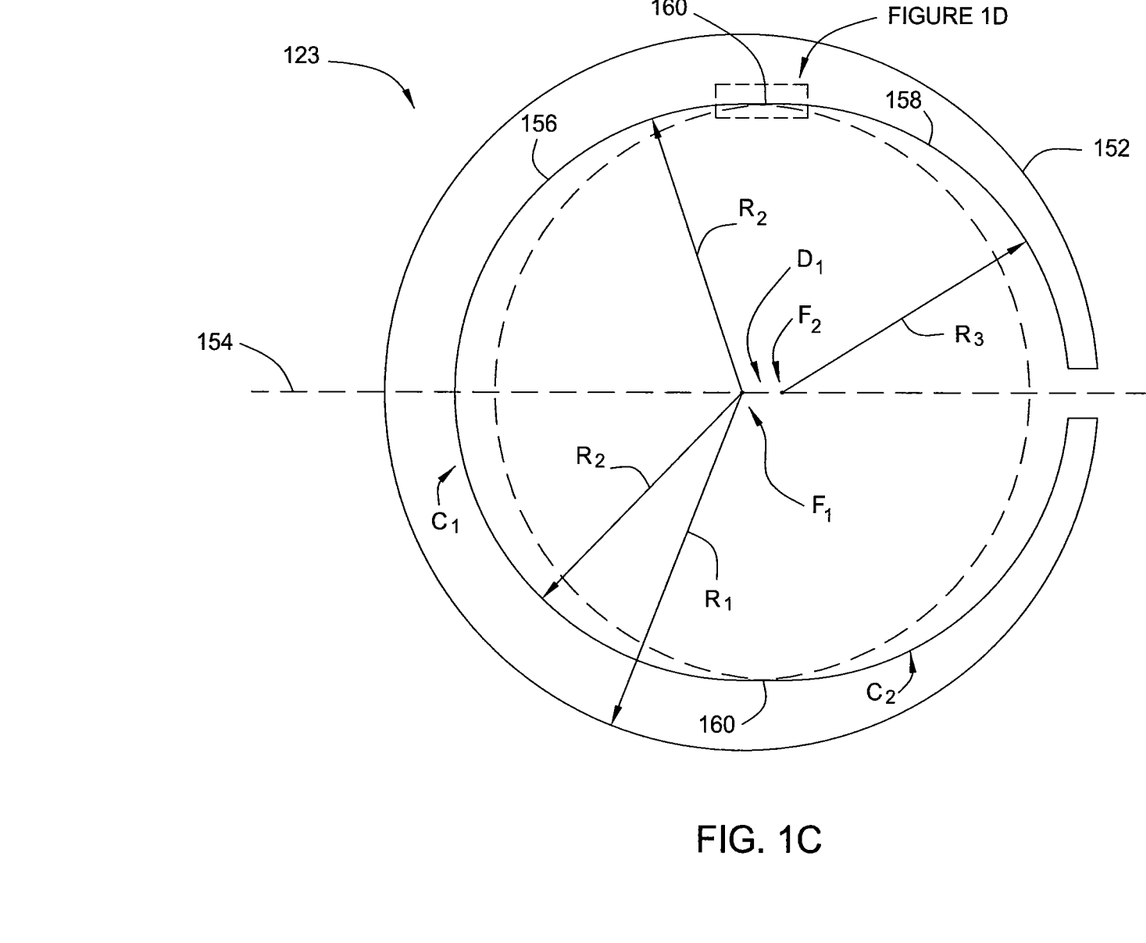

FIGS. 1B and 1C are top plan views of the pre-heat ring shown in the embodiment of FIG. 1A. FIG. 1B illustrates the pre-heat ring 123 disposed around the periphery of the substrate support 138 while in a processing position. The pre-heat ring 123 is an incomplete ring having a gap 150 therein. The gap 150 allows for thermal expansion and reduces the occurrence of stress fractures or breaking while handling the pre-heat ring 123. The gap 150 is generally oriented toward an exhaust outlet when positioned in a processing chamber. It is contemplated that the pre-heat ring 123 may be a complete ring structure, thus lacking gap 150.

The outer edge of the substrate support 138 and the outer edge 152 of the pre-heat ring 123 are circular. The inner edge 153 of the pre-heat ring 123 is oblong or elongated and resembles an oval shape. Thus, the pre-heat ring 123 can be formed by removing material from the inner edge of a ring-like pre-heat ring. The width of the pre-heat ring near the gap 150 is less than the width of the pre-heat ring 123 on the opposite side of pre-heat ring 123. The changing width of the pre-heat ring 123 results in a larger gap 142 positioned near an exhaust outlet, and a smaller gap 140 positioned near an upper gas inlet. Therefore, the purge gas introduced to a processing chamber from beneath the substrate support 138 and the pre-heat ring 123 will flow through gap 142 at a greater volumetric flow rate than the purge gas flowing through gap 140 and over the substrate support 138. For example, about 20 percent to about 500 percent more purge gas will flow through gap 142 as compared to gap 140. However, it is contemplated that one skilled in the art can adjust the widths of gaps 140 and 142 to allow the desired volumetric flow rates therethrough. Furthermore, it should be noted that while purge gas is describe as flowing through the gap 140 and the gap 142, purge gas actually flows around the entire perimeter of the substrate support 138. Thus, purge gas flowing through the gap 140 can be considered the purge gas flowing through the gap having constant width around the substrate support 138. Additionally, the purge gas flowing through the gap 142 can be considered the purge gas flowing through the gap having a varying width around the substrate support 138.

FIG. 1C is a top plan view of a pre-heat ring shown in the embodiment of FIG. 1A. FIG. 1C illustrates the geometric relationships of the pre-heat ring 123. As FIG. 1C illustrates, the pre-heat ring 123 has a constant outer radius $R_1$ as measured from the center point $F_1$. Center point $F_1$ is the center point of the outer circumference of pre-heat ring 123 and is positioned on centerline 154. Thus, the outer edge 152 of pre-heat ring 123 is circular. The pre-heat ring 123 has an inner radius $R_2$ measured from the center point $F_1$. The inner radius $R_2$ defines a circle $C_1$, part of which is shown in phantom. It is to be understood that the solid lines define the edges of the pre-heat ring 123, while the phantom lines are shown to assist in explanation of the shape of the pre-heat ring 123. Returning to the circle $C_1$, the solid lines on the left side define a first portion 156, which corresponds to a portion of the inner edge of the pre-heat ring 123. The first portion 156 has a constant radius $R_2$ measured from the center point $F_1$ of outer edge 152 (circumference) of the pre-heat ring 123.

The remainder of the inner edge of the pre-heat ring 123 is defined by a second portion 158 and tangential portions 160. The second portion 158 is part of a circle $C_2$, which is the circle formed by radius $R_3$ (which is equivalent in length to radius $R_2$) having a center point $F_2$. The center point $F_2$ is located a distance $D_1$ from center point $F_1$ along the horizontal centerline 154. Thus, while circle $C_1$ is concentric with the outer edge 152 of pre-heat ring 123, circle $C_2$ is not concentric with the outer edge 152. Furthermore, since $R_2$ and $R_3$ are equal in length, circle $C_1$ and circle $C_2$ are equal in size. Since circle $C_2$ is not concentric with the outer edge 152, the width of the pre-heat ring 123 proximate to the first portion 156 is greater than the width of the pre-heat ring 123 proximate to the second portion 158. The non-concentric formation of circles $C_1$ and $C_2$ results in a larger gap near a first side of a substrate support compared to a second side of a substrate support when pre-heat ring 123 is positioned around a substrate support in a processing position.

The remainder of the inner edge of the pre-heat ring 123 is defined by the tangential portions 160, which are lines tangent to both circles $C_1$ and $C_2$. The tangential portions 160 have approximately the same length as distance $D_1$ between center point $F_1$ and center point $F_2$. The distance $D_1$ can be increased or decreased depending on the desired gap between the pre-heat ring 123 and either side of the substrate support. For a substrate support adapted to support a 300 millimeter substrate, the distance $D_1$ is about 1 millimeter to about 10 millimeters, such as about 3 millimeters. Thus, the gap along one edge of the substrate support may be equal to the gap along the opposite edge of the substrate support, plus about one percent of the diameter or width of a substrate.

Figure 1D:
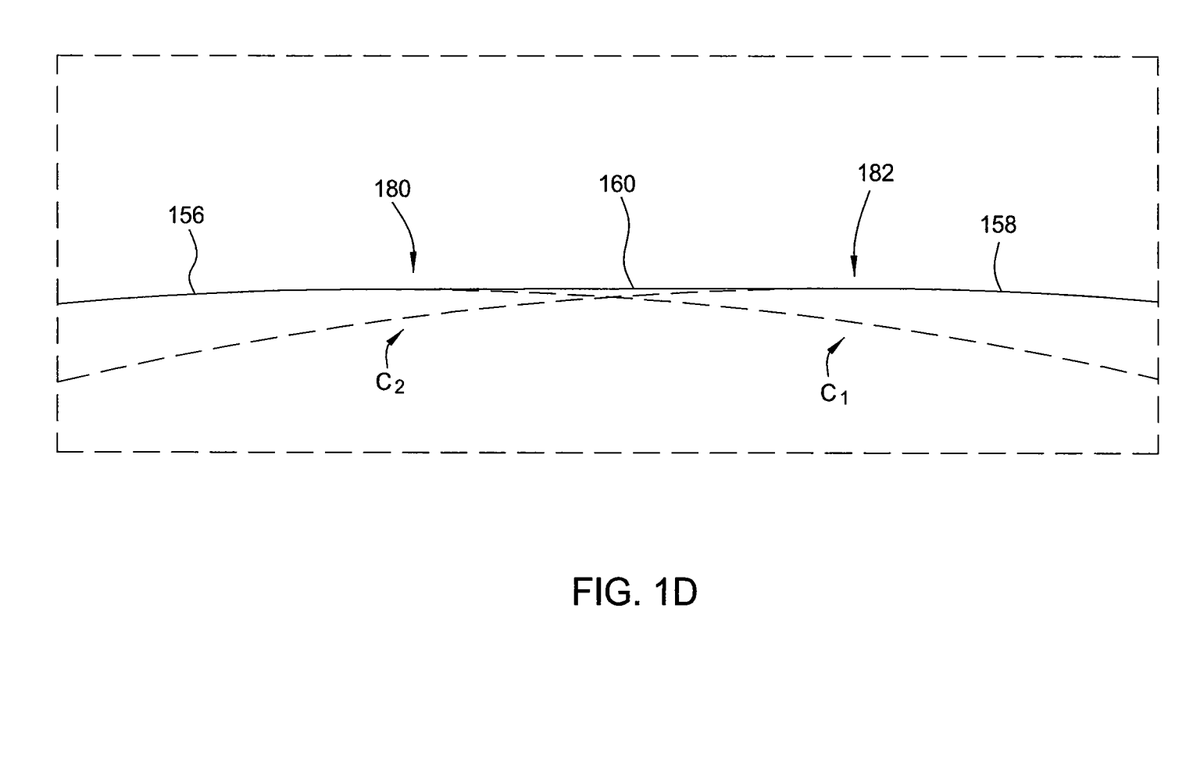
FIG. 1D is an enlarged view of a portion of the pre-heat ring shown in FIG. 1C.

FIG. 1D is an enlarged view of a portion of the pre-heat ring shown in FIG. 1C. FIG. 1D illustrates the first portion 156 of the circle $C_1$ as well as the second portion 158 of the circle $C_2$. The first portion 156 of the circle $C_1$ is connected to the second portion of the circle $C_2$ by the tangential portion 160. The tangential portion 160 is a portion of a line which is tangent to both the circles $C_1$ and $C_2$. Specifically, the tangential portion 160 is tangent to the circle $C_1$ at the point 180 and is tangent to the circle $C_2$ at the point 182. Thus, the inner edge of the pre-heat ring is linear along tangential portion 160, and is curved along the first portion 156 and the second portion 158.

FIGS. 2A-2D are plan views of pre-heat rings according to other embodiments of the invention. FIGS. 2A-2D illustrate pre-heat rings 223A-223D. The pre-heat rings 223A-223D have circular inner and outer edges which are concentric with one another, and are adapted to be positioned around the periphery of a substrate support. The pre-heat rings 223A-223D are formed from graphite and coated with silicon carbide. It is contemplated that pre-heat rings 223A-223D may be formed from other materials, such as silicon carbide or quartz.

Since the inner edges of the pre-heat rings 223A-223D are circular, when the pre-heat rings 223A-223D are positioned in a processing chamber, a gap of uniform width will be formed between the pre-heat rings 223A-223D and a substrate support. However, the pre-heat rings 223A-223D still induce a greater volumetric gas flow rate near an exhaust outlet of a chamber by having cut-outs formed therein. The cut-outs in the pre-heat rings 223A-223D are positioned near the exhaust outlet. Thus, more purge gas should flow through the cut-outs and out the exhaust conduit as opposed to through the gap between the pre-heat rings 223A-223D and the substrate support along the leading edge of the substrate support (e.g., near the process gas inlet). The purge gas is directed through the cut-outs because of the reduced resistance to gas flow caused by the cut-outs within the pre-heat rings 223A-223D (e.g., the purge gas has a greater cross sectional area to flow through, thus reducing resistance). Therefore, the pre-heat rings 223A-223D have an effect similar to the pre-heat ring 123. More specifically, the pre-heat rings 223A-223D also induce a greater volumetric flow rate of purge gas around an exhaust side of the substrate support as compared to the volumetric flow rate around the leading edge (gas inlet edge) of the substrate support.

Figure 2A:
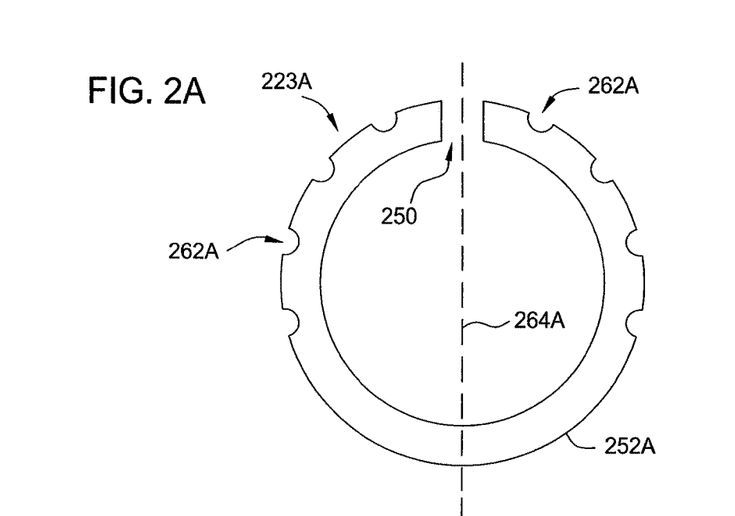
FIGS. 2A-2D are plan views of pre-heat rings according to other embodiments of the invention.

FIG. 2A illustrates one embodiment of a circular pre-heat ring having cut-outs. The pre-heat ring 223A includes a plurality of cut-outs 262A formed in the outer edge 252A of the pre-heat ring 223A. The cut-outs 262A are semi-circular shapes removed from the outer edge 252A of pre-heat ring 223A, thus forming a scalloped outer edge 252A. The cut-outs 262A are symmetrically positioned about an axis 264A to cause a uniform gas flow along each side of a substrate support (and a substrate positioned thereon) located within the pre-heat ring 223A. Specifically, four cut-outs 262A are positioned on each side of the axis 264A. The cutouts are evenly spaced along the outer edge 252A. In a processing position, the pre-heat ring 223A would be oriented in a processing chamber such that a gap 250 is directed towards an exhaust outlet.

Figure 2B:
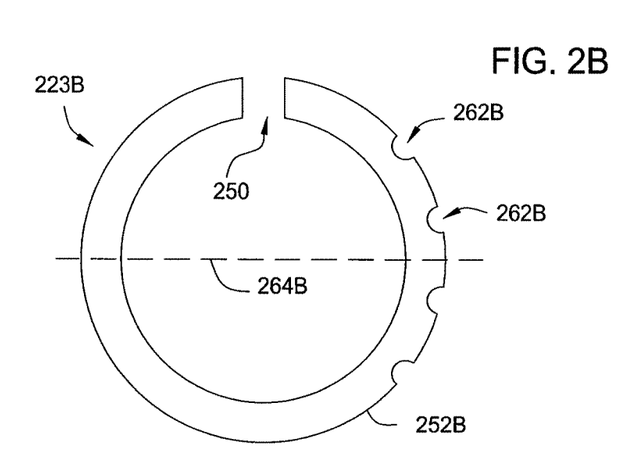

FIG. 2B illustrates another embodiment of a circular pre-heat ring having cut-outs. The pre-heat ring 223B includes a plurality of cut-outs 262B formed in the outer edge 252B of the pre-heat ring 223B. The cut-outs 262B are semi-circular shapes removed from the outer edge 252B of the pre-heat ring 223B, thus forming a scalloped outer edge 252B. The cut-outs 262B (excluding the gap 250) are symmetrical along the axis 264B and spaced evenly apart. The cut-outs 262B are only formed along one side of the outer edge of the pre-heat ring 223B, and the size of the cut-outs 262B may be greater than the size of the cut-outs 262A to compensate for the reduced quantity. In a processing position, the gap 250 of pre-heat ring 223B would be positioned parallel to the flow direction and the exhaust outlet. The pre-heat ring 223B may be useful in processing chambers in which purge gas inlets are not evenly distributed around the circumference of a substrate support disposed therein.

Figure 2C:
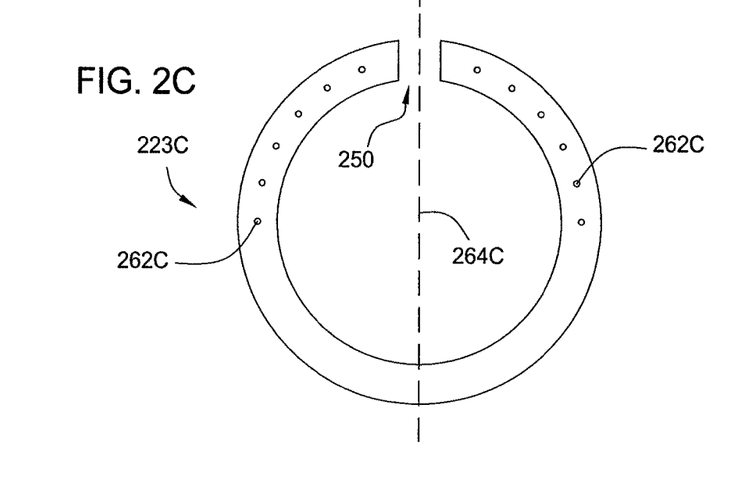

FIG. 2C illustrates another embodiment of a circular pre-heat ring having cut-outs. The pre-heat ring 223C includes a plurality of cut-outs 262C formed within the pre-heat ring 223C. The cut-outs 262C are circular holes removed from the interior of pre-heat ring 223C. The cut-outs 262C are symmetrical along the axis 264C, with six holes being positioned on each side of the axis 264C. The cut-outs 262C are spaced equal distances from one another. The pre-heat ring 223C lacks any cut-outs in the leading edge (e.g., the edge to be positioned near a gas inlet), since it is desirable to increase gas flow near the exhaust outlet during processing. This is accomplished by positioning more cut-outs 262C within the pre-heat ring 223C near the exhaust side of the processing chamber. Similar to the pre-heat ring 223A, the gap 250 is aligned with the exhaust outlet within the process chamber.

Figure 2D:
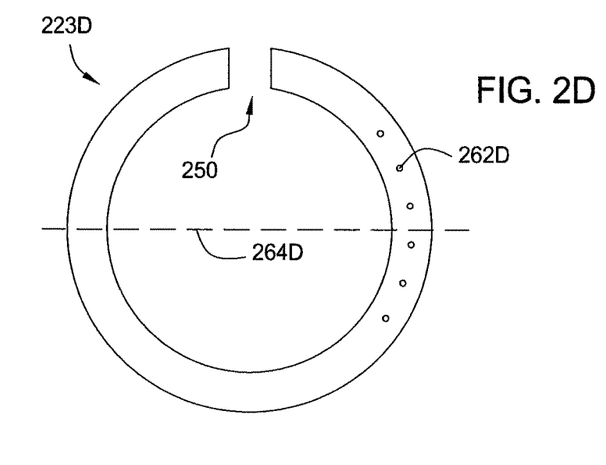

FIG. 2D illustrates another embodiment of a circular pre-heat ring having cut-outs. The pre-heat ring 223D includes a plurality of cut-outs 262D formed within the pre-heat ring 223D. The cut-outs 262D are equally-spaced circular holes removed from the interior of pre-heat ring 223D. The cut-outs 262D (excluding gap 250) are symmetrical along the axis 264D, with three holes being positioned on each side of the axis 264D. In a processing position, the gap 250 would be oriented parallel to the flow direction of a process gas.

Although the pre-heat rings 223A-223D of FIGS. 2A-2D have been described as including a particular number of cut-outs, it is contemplated that pre-heat rings 223A-223D may include more or less cut-outs as necessitated by processing conditions. Additionally, it is contemplated that the size, shape, position, and spacing can also be varied according to process requirements. It is to be understood that processing conditions such as gas flow rate, chamber size, chamber pressure, and substrate size, among other factors, can affect gas flow rates within a processing chamber. Thus, it will become apparent to one skilled in the art that cut-out size, shape, quantity, position and spacing can be varied to induce a greater gas flow rate near the exhaust conduit of the processing chamber as opposed to the process gas inlet of the processing chamber.

Advantages of the present invention include, but are not limited to increased control of gas flow characteristics, which results in increased substrate throughput and increased deposition uniformity. The gas pre-heat ring of embodiments described herein allows for a greater flow rate of purge gas to be introduced to a processing chamber without affecting process uniformity. Thus, the amount of time to perform a deposition process is decreased, and substrate throughput is increased. Process uniformity is not affected because the process gas entering the chamber through the process gas inlet does not experience a significant concentration dilution, such as that which would occur absent the inclusion of the pre-heat ring as described herein. Since the process gas is not diluted, the deposition process does not become sensitive to changes in the process gas concentration. Further, since relatively less purge gas is directed near the gas inlet, the process gas entering the chamber does not experience as much turbulence as would otherwise be induced. Therefore, the pre-heat ring as described herein provides greater control of the flow characteristics of a gas, which increases substrate throughput and deposition uniformity.

While the foregoing is directed to embodiments of the present invention, other and further embodiments of the invention may be devised without departing from the basic scope thereof, and the scope thereof is determined by the claims that follow.

We claim:

1. A pre-heat ring for a substrate processing chamber, comprising:
an incomplete ring of material having a gap formed therein, the incomplete ring of material having an inner edge and an outer edge, the outer edge having a constant radius and the inner edge having an oblong shape, wherein the oblong shape of the inner edge comprises:
a first portion having a constant radius measured from a center of a circle defined by an outer circumference of the incomplete ring of material;
a second portion having a constant radius measured from a location other than the center of a circle defined by an outer circumference of the incomplete ring of material; and
linear portions connecting the first portion and the second portion.

2. The pre-heat ring of claim 1, wherein the width of the incomplete ring of material proximate to the first portion is greater than the width of the incomplete ring of material proximate to the second portion.

3. The pre-heat ring of claim 2, wherein the width of the incomplete ring of material proximate to the first portion is constant.

4. The pre-heat ring of claim 3, wherein the incomplete ring of material proximate to the second portion has a varying width.

5. The pre-heat ring of claim 4, wherein the material is selected from the group consisting of quartz, silicon carbide, and graphite coated with silicon carbide.

6. A processing chamber, comprising:
a chamber body;
an exhaust outlet positioned on a first side of the chamber body;
a gas inlet positioned on a second side of the chamber body;
a substrate support disposed within the chamber body; and
a pre-heat ring positioned around a periphery of the substrate support, the pre-heat ring comprising an incomplete ring of material having a gap formed therein, the incomplete ring of material having an inner edge and an outer edge, the outer edge having a constant radius and the inner edge having an oblong shape, wherein the oblong shape of the inner edge comprises:
a first portion having a constant radius measured from a center of a circle defined by an outer circumference of the incomplete ring of material;
a second portion having a constant radius measured from a location other than a center of a circle defined by an outer circumference of the incomplete ring of material; and
linear portions connecting the first portion and the second portion.

7. The processing chamber of claim 6, wherein a gap between the pre-heat ring and the substrate support proximate to the exhaust outlet is greater than a gap between the pre-heat ring and the substrate support proximate to the gas inlet.

8. The processing chamber of claim 6, wherein the incomplete ring of material comprises graphite coated with silicon carbide.

9. The processing chamber of claim 6, wherein a width of the incomplete ring of material proximate to the first portion is constant.

10. The processing chamber of claim 9, wherein the incomplete ring of material proximate to the second portion has a varying width.

11. The process chamber of claim 10, wherein the incomplete ring of material comprises graphite coated with silicon carbide.

12. The pre-heat ring of claim 1, wherein the location other than the center of a circle defined by an outer circumference of the incomplete ring of material is positioned on a centerline of the incomplete ring.

13. The pre-heat ring of claim 12, wherein the location other than the center of a circle defined by an outer circumference of the incomplete ring of material is positioned about 1 millimeter to about 10 millimeters from the center of a circle defined by an outer circumference of the incomplete ring of material.

14. The pre-heat ring of claim 1, wherein the constant radius of the first portion is equal to the constant radius of the second portion.

15. The pre-heat ring of claim 14, wherein the first portion and the second portion are semi-circles.

16. A pre-heat ring for a substrate processing chamber, comprising:
an incomplete ring of material having a gap formed therein, the incomplete ring of material having an inner edge and an outer edge, the outer edge having a constant radius and the inner edge having an oblong shape, wherein the oblong shape of the inner edge comprises:
a first portion having a constant radius measured from a center of a circle defined by an outer circumference of the incomplete ring of material;
a second portion having a constant radius measured from a location other than the center of a circle defined by an outer circumference of the incomplete ring of material; and
linear portions connecting the first portion and the second portion, wherein a first linear portion and a second linear portion are each located 90 degrees relative to the gap formed in the incomplete ring of material.

17. The pre-heat ring of claim 16, wherein the incomplete ring of material has a constant thickness between each of the linear portions opposite the gap.

\* \* \* \* \*